United States Patent [19]

Mayeda

[11] Patent Number: 5,614,249
[45] Date of Patent: Mar. 25, 1997

[54] LEAK DETECTION SYSTEM FOR A GAS MANIFOLD OF A CHEMICAL VAPOR DEPOSITION APPARATUS

[75] Inventor: Mark I. Mayeda, Las Vegas, Nev.

[73] Assignee: LSI Logic Corporation, Milpitas, Calif.

[21] Appl. No.: 520,030

[22] Filed: Aug. 28, 1995

[51] Int. Cl.⁶ .................................................. B05D 3/00
[52] U.S. Cl. ............................ 427/8; 73/865.9; 118/715; 118/733
[58] Field of Search ................... 73/1 R, 1 G, 3, 73/865.9; 118/715, 723 E, 725, 729, 733; 427/8, 140, 142; 437/235, 238, 241, 244

[56] References Cited

U.S. PATENT DOCUMENTS

| 5,233,861 | 8/1993 | Gore et al. | 73/3 |
| 5,362,526 | 11/1994 | Wang et al. | 427/238 X |
| 5,498,578 | 3/1996 | Steele et al. | 437/235 |

*Primary Examiner*—Michael Lusignan
*Attorney, Agent, or Firm*—Hickman Beyer & Weaver

[57] ABSTRACT

A chemical vapor deposition apparatus includes a gas manifold having a first gas flow port through which a gas flow path extends, and a first peripheral surface which extends about the first gas flow port. The chemical vapor deposition apparatus further includes a second gas flow port through which the gas flow path extends, and a second peripheral surface extending about the second gas flow port. A connection of the gas manifold is provided such that the first and second peripheral surfaces substantially mutually engage intended for providing a substantial seal of the gas flow path. A groove is provided in at least one of the first and second peripheral surfaces and extends so as to communicate with at least one of the first and second gas flow ports. The groove facilitates flow of a test gas therein from outside the chemical vapor deposition apparatus towards the respective gas flow port.

A method for checking seals of a chemical vapor deposition apparatus gas manifold includes providing groove in a least one of a pair of mutually engaging peripheral surfaces which surround a gas flow port through which a gas flow path of the gas manifold extends. The groove extends so as to communicate with the gas flow port for facilitating flow of a test gas in the groove. A vacuum is drawn in the gas mixing manifold while a test gas is provided in an area proximate the gas manifold seal, and the entrance of the test gas inside the gas flow path through the seal is detected in order to determine the reliability of the seal.

19 Claims, 4 Drawing Sheets

5,614,249

LEAK DETECTION SYSTEM FOR A GAS MANIFOLD OF A CHEMICAL VAPOR DEPOSITION APPARATUS

BACKGROUND OF THE INVENTION

The present invention relates generally to a chemical vapor deposition (CVD) apparatus. More particularly, improvements to a gas manifold of a CVD apparatus, and a method for testing a seal of a CVD apparatus gas manifold for leaks are disclosed.

Chemical vapor deposition (CVD) apparatus are known for use in the fabrication of integrated circuit chips. CVD apparatus in particular are used for depositing layers of certain materials such as polysilicon, tungsten, and silicon nitride on a semiconductor wafer substrate. In the CVD process, gaseous reactants chemically react to deposit individual atoms of a particular element or elements on the wafer surface. The deposition reaction occurs in a hermetically sealed chamber in which the wafer substrate is placed. The gaseous reactants are first fed through a gas manifold arranged outside the sealed chamber, and then from the gas manifold into the sealed chamber.

FIGS. 1 and 2 illustrate a gas manifold 10 of a conventional CVD reactor, such as the P-5000 available from Applied Materials, Inc. of Santa Clara, Calif. Gas manifold 10 includes a quartz gas feed tube housing 12, a gas feed endblock 14, and a gas inject endblock 16. Endblocks 14 and 16 are connected to a gas chamber lid 18 of the CVD reactor. The CVD reactor further includes a cooling water manifold 20 and cooling water endblock 22. Gaseous reactants are fed first through the lower end of gas feed endblock 14, then through housing 12, through gas inject endblock 16, and finally through a mixer gas box 24 arranged in the sealed chamber of the CVD apparatus.

FIG. 2 shows the assembly of the various parts of gas manifold 10. O-ring kalrez gaskets 26 are arranged in respective gas flow ports of endblocks 14 and 16. Metal spacers 28 and spring wave washers 30 are interposed between gaskets 26 and quartz gas feed tubes 32, which are fit in ceramic resistors 34 and housed in housing 12. Screw and washer assemblies 36 are used to connect endblocks 14 and 16 to housing 12, so that gaskets 26 provide sealed gas flow paths extending through respective aligned gas flow ports of housing 12 and endblocks 14 and 16. O-ring vitton gaskets 38 are also arranged about both of the gas flow paths shown.

Gas manifold 10 must be frequently checked for leaks. Leaks can introduce oxygen into the CVD apparatus and thereby damage wafers and/or the apparatus itself. Large leaks can quickly do substantial damage, but are rather easy to detect. Microleaks, which often occur at seals on the gas flow path, can also do substantial damage and, in addition, can be quite difficult to detect. In the system shown in FIG. 2, a gas leakcheck hole 40, normally closed by seal plug 42, is provided for this purpose. Gas leakcheck hole 40 extends in gas feed endblock 14, from an upper surface thereof to a surface thereof which engages with a surface of housing 12. Leak checking is performed by drawing a vacuum in the sealed chamber of the CVD apparatus, feeding a leak check gas such as helium into the gas leakcheck hole 40, and determining, with a conventional gas detection apparatus, whether the leakcheck gas has entered into the sealed chamber. The presence of leakcheck gas in sealed chamber would indicate that helium has entered through a leak in gas manifold assembly 10.

A particular problem observed with conventional CVD apparatus gas manifolds is that the leakcheck gas may not detect microleaks in the various seals along the gas flow paths. It has even been observed that microleaks in the seals between gas feed endblock 14 and quartz feed tube housing 12 are frequently missed by leak checking through leakcheck hole 40. This problem arises because the leakcheck gas has no clear path to the potentially leaking seals. In some cases, it happens that the leakcheck gas is detected in the sealed vacuum chamber, however in such a small amount, or with a "weak" indication, which could lead to uncertainty as to whether or not the gas manifold assembly has a defective seal. Additionally, it may happen that a strong indication of leakcheck gas in the vacuum chamber is detected, however the leakcheck operator is given no indication as to which of the many seals in the gas manifold is defective.

SUMMARY OF THE INVENTION

The present invention provides improvements to a gas manifold of a CVD apparatus, so that testing the seals of the gas manifold with gas leakcheck testing can identify microleaks and can generally provide results which are more certain and precise.

Specifically, the invention provides a low-resistance path for access of a test gas from outside the gas manifold to selected gas flow ports. Test gas which easily enters a selected gas flow port without substantial obstruction will provide a relatively certain testing of a seal at the selected gas flow port. A plurality of access channels for test gas may be provided at various points in the CVD apparatus with respect of the gas manifold, thereby to allow specific leak testing at selected points in the apparatus. A test operator accordingly is allowed to ascertain the existence of small leaks in the apparatus with an increased degree of reliability, and the location of any detected leak is more precisely determined. These determinations are particularly advantageous since they will allow a leaky gas manifold to be disassembled only if necessary and at the location of the leak.

According to one aspect of the invention, a chemical vapor deposition apparatus is provided which includes a gas manifold having a first gas flow port through which a gas flow path extends, and a first peripheral surface which extends about the first gas flow port. The chemical vapor deposition apparatus further includes a second gas flow port through which the gas flow path extends, and a second peripheral surface extending about the second gas flow port. A connection of the gas manifold is provided such that the first and second peripheral surfaces substantially mutually engage to provide a substantial seal of the gas flow path. A groove is provided in at least one of the first and second peripheral surfaces and extends so as to communicate with at least one of the first and second gas flow ports. The groove facilitates flow of a test gas therein from outside the chemical vapor deposition apparatus towards the respective gas flow port.

The first gas flow port and first peripheral surface may be provided on an endblock of the gas manifold, and the second gas flow port and second peripheral surface may be provided on either a gas feed tube housing of the gas manifold or on another part of the chemical vapor deposition apparatus such as a gas chamber lid to which the endblock of the gas manifold is connected.

According to a method aspect of the invention, seals of a chemical vapor deposition apparatus gas manifold are checked for leaks. A groove is provided in a least one of a pair of mutually engaging peripheral surfaces which surround a gas flow port through which a gas flow path of the gas manifold extends. The groove extends so as to communicate with the gas flow port for facilitating flow of a test gas in the groove. A vacuum is drawn in the gas mixing manifold while a test gas is provided in an area proximate the gas manifold seal, and the entrance of the test gas inside the gas flow path through the seal is detected in order to determine the reliability of the seal. The test gas may be helium, and the step of drawing a vacuum in the gas manifold may include drawing a vacuum in a sealable chamber to which the gas manifold is connected, thereby detection of the test gas inside the chamber is performed.

According to a further aspect of the invention, a chemical vapor apparatus with a gas mixing manifold is provided. The gas mixing manifold includes a first seal connection between a first end of a gas feed tube housing and a gas feed endblock, and a second seal connection between a second end of the gas feed tube housing and a gas inject endblock. The seal connections include gaskets and mutually engaging peripheral surfaces which surround gas flow ports through which gas flow paths extend inside the gas mixing manifold. At least one channel is provided which interconnects a selected gas flow port with the outside of the gas mixing manifold. The channel includes at least one groove portion carved in a selected peripheral surface and arranged in contact with the selected gas flow port. The channel may extend in the gas feed endblock, in the gas feed tube housing, in the gas inject endblock, or entirely in the selected peripheral surface.

BRIEF DESCRIPTION OF THE DRAWINGS

The invention, together with further advantages thereof, may best be understood by reference to the following description taken in conjunction with the accompanying drawings in which:

FIG. 4b is a top plan view of the gas inject endblock of FIG. 4a;

FIG. 4c is a front elevation view of the gas inject endblock of FIG. 4a;

FIG. 5b is a side elevation view of the housing of FIG. 5a.

DESCRIPTION OF THE PREFERRED EMBODIMENTS

Figure 1:
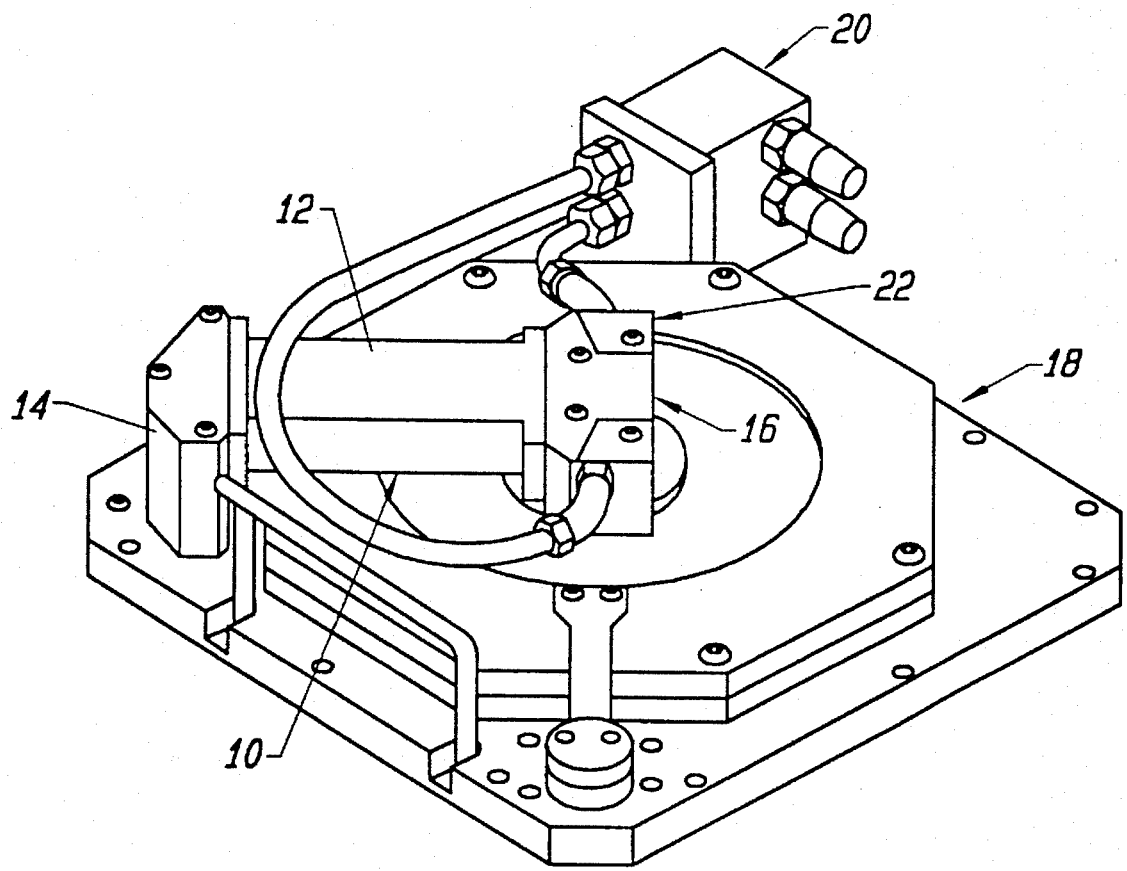
FIG. 1 is top perspective view of a chamber lid and gas manifold of a chemical vapor deposition apparatus of the prior art.
Figure 2:
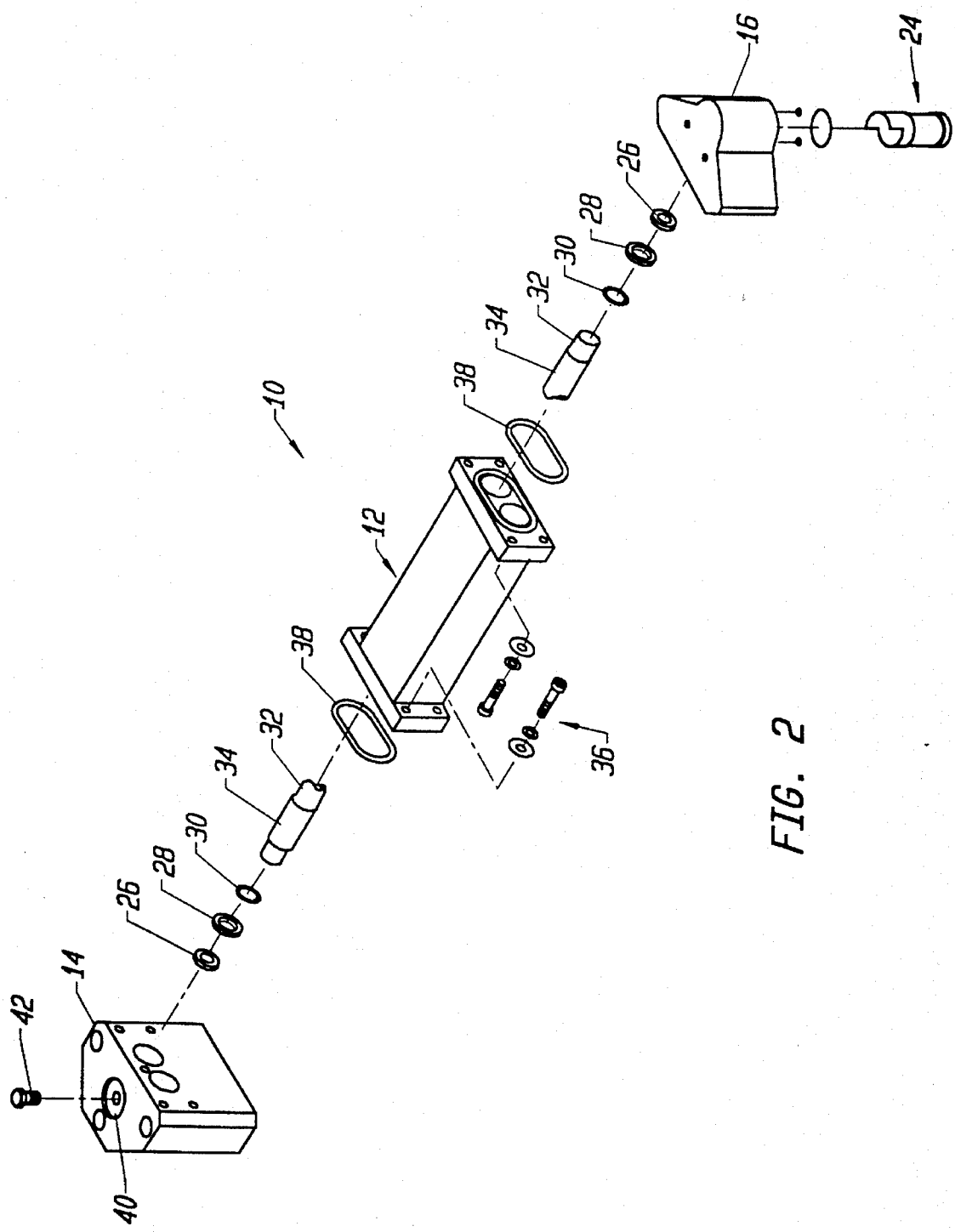
FIG. 2 is an exploded perspective view of the gas manifold of FIG. 1.
Figure 3:
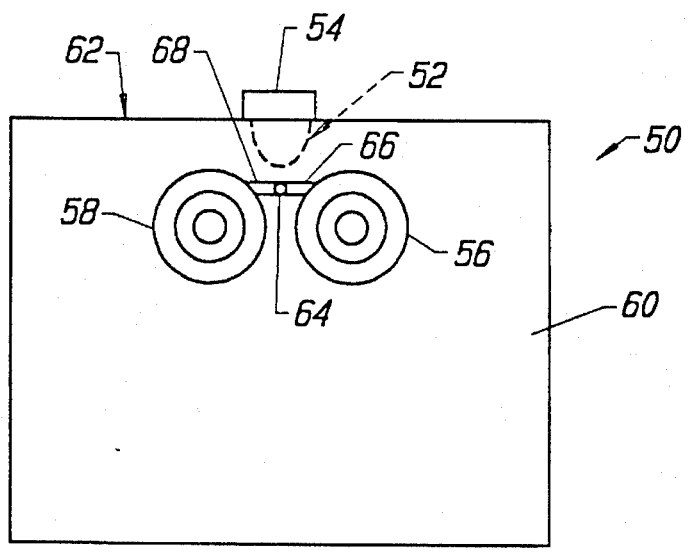
FIG. 3 is a front elevation view of a gas feed endblock of a gas manifold in accordance with one aspect of the invention.

Having described the gas manifold of a conventional chemical vapor deposition reactor of FIGS. 1 and 2 previously, attention is directed to FIGS. 2–6 which illustrate improvements to a gas manifold of a CVD apparatus in accordance with the present invention, wherein like components are represented by like reference numerals. FIG. 3 shows a gas feed endblock 50 in accordance with one aspect of the present invention. Gas feed endblock 50 may be substituted for gas feed endblock 14 in the gas manifold of FIGS. 1 and 2 previously described, and includes similarly thereto a gas leakcheck hole 52 which is sealable by a seal plug 54, a pair of gas flow ports 56 and 58 through which respective gas flow paths extend and adapted for receiving respective gaskets, and a peripheral surface 60 extending around and surrounding gas flow ports 56 and 58.

Gas leakcheck hole 52 extends from a top surface 62 of gas feed endblock 50 to peripheral surface 60, where it has a hole or port 64 arranged between gas flow ports 56 and 58. A first groove portion 66 and a second groove portion 68 are provided, for example by cutting or milling, into peripheral surface 60. First groove portion 66 connects gas flow port 56 to port 64 of gas leakcheck hole 52, while second groove portion 68 connects gas flow port 58 to port 64 of gas leakcheck hole 52.

When connected in the gas manifold of FIGS. 1 and 2, gas flow ports 56 and 58 are substantially aligned with respective gas flow ports of gas feed tube housing 12, which includes a peripheral surface surrounding these respective gas flow ports and engaging peripheral surface 60 of gas feed endblock 50. Gas flow paths extend through the aligned gas flow ports. The mutually engaging peripheral surfaces provide a seal, optimally with the presence of gaskets 26 and spring wave washers 30, for the gas flow paths inside the gas manifold of the CVD apparatus.

Groove portions 66 and 68 combine with gas leakcheck hole 52 to provide a channel which communicates between gas flow ports 56 and 58, inside the gas manifold, and the outside of the gas manifold. Testing a seal for leaks includes drawing a vacuum inside the gas manifold, providing a test gas in an area proximate the seal, and detecting the entrance of the test gas inside the gas flow path through the seal to determine the reliability of the seal. If no test gas is detected in the gas flow path, the seal is assumed to be reliable and have no leaks.

A preferred method of testing the seal for leaks includes drawing a vacuum in a sealable chamber of a CVD apparatus to which the gas manifold of the invention is connected, for example in a manner as shown in FIG. 1. Drawing a vacuum in the sealable chamber will draw a vacuum in the gas manifold, and detection of the test gas may take place by detecting the presence of the test gas inside the sealable chamber. In a preferred embodiment, the test gas is helium and a conventional helium detector, such as the Balzer HCT 160 helium detector available from Varian Company of Palo Alto, Calif., is employed.

According to the invention, a substantially unobstructed channel, which is removably sealable, is provided which directly connects gas flow ports 56 and 58 to the outside of the gas manifold, and a free flow of a test gas in the channel to gas flow ports 56 and 58 is greatly facilitated. In this manner, a reliably precise testing of a seal of a gas flow path through gas flow ports 56 and 58 is provided.

Figure 4A:
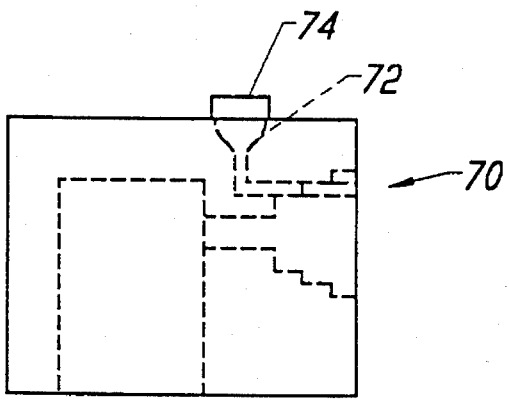
FIG. 4a is a side elevation view of a gas inject endblock of a gas manifold in accordance with another aspect of the invention.
Figure 4B:
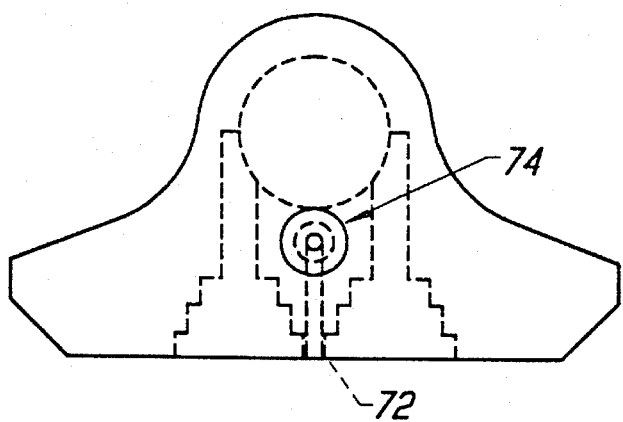
Figure 4C:
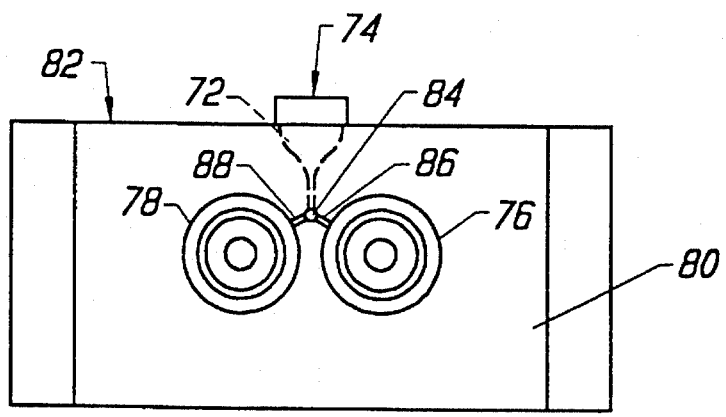

FIGS. 4a, 4b, and 4c illustrate a gas inject endblock 70 in accordance with a further aspect of the invention. Gas inject endblock 70 may be substituted for gas inject endblock 16 in the gas manifold of FIGS. 1 and 2 previously described, and includes similarly thereto a pair of gas flow ports 76 and 78 through which respective gas flow paths extend and adapted for receiving respective gaskets, and a peripheral surface 80 extending around and surrounding gas flow ports 76 and 78.

Gas inject endblock 70 also includes a gas leakcheck hole 72 which is sealable by a seal plug 74, both configured similarly to the previously described gas leakcheck hole and seal plug of gas feed endblock 50; Gas leakcheck hole 72 extends from a top surface 82 of gas inject endblock 70 to peripheral surface 80, where it has a hole or port 84 arranged between gas flow ports 76 and 78. A first groove portion 86 and a second groove portion 88 are provided, for example by cutting or milling, into peripheral surface 80. First groove portion 86 connects gas flow port 76 to port 84 of gas leakcheck hole 72, while second groove portion 88 connects gas flow port 78 to port 84 of gas leakcheck hole 72.

When connected in the gas manifold of FIGS. 1 and 2, gas flow ports 76 and 78 are substantially aligned with respective gas flow ports of gas feed tube housing 12, which includes a peripheral surface surrounding these respective gas flow ports and engaging peripheral surface 80 of gas inject endblock 70. Gas flow paths extend through the aligned gas flow ports. The mutually engaging peripheral surfaces provide a seal, optimally with the presence of gaskets 26 and spring wave washers 30, for the gas flow paths inside the gas manifold of the CVD apparatus.

Groove portions 86 and 88 combine with gas leakcheck hole 72 to provide an essentially unobstructed channel which communicates between gas flow ports 76 and 78 and the outside of the gas manifold, and a free flow of a test gas in the channel to gas flow ports 76 and 78 is greatly facilitated. Testing a seal of gas flow paths extending through gas flow ports 76 and 78 may be performed in a similar manner to that previously described with regard to the embodiment of FIG. 3, so that a reliable and precise testing of a seal is provided.

Gas feed endblock 50 and gas inject endblock 70 may be simultaneously substituted respectively for gas feed endblock 14 and gas inject endblock 16 in the gas manifold of FIGS. 1 and 2. In this manner, a plurality of substantially unobstructed access channels for test gas may be provided at various points in the CVD apparatus with respect of the gas manifold, thereby to allow specific leak testing at selected seal points in the apparatus. During the leak testing, a test gas may be provided proximate gas leakcheck hole 52 and detection of the test gas in the gas manifold may be made, and then a test gas may be provided proximate gas leakcheck hole 72 with subsequent detection of the test gas in the gas manifold.

Groove portions 66,68 and 86,88 described previously are provided on respective peripheral surfaces 60 and 80 of respective endblocks 50 and 70. Such groove portions however may be substituted, separately or together i.e. in any combination, with similar groove portions which are provided on the peripheral surfaces of housing 12 which are arranged opposite to and which engage peripheral surfaces 60 and 80 as described previously. These substituted groove portions would accordingly be arranged so as to connect respective gas flow ports of housing 12 with ports 64 and 84 of gas leak checkholes 52 and 72, which would also create substantially unobstructed channels for test gas flow from outside the gas manifold to gas flow ports in the manifold for checking seals of gas flow paths extending through the gas flow ports. Alternatively, a combination of groove portions on both of the oppositely facing and mutually engaging peripheral surfaces could be arranged so as to create unobstructed channels for test gas flow.

Figure 5A:
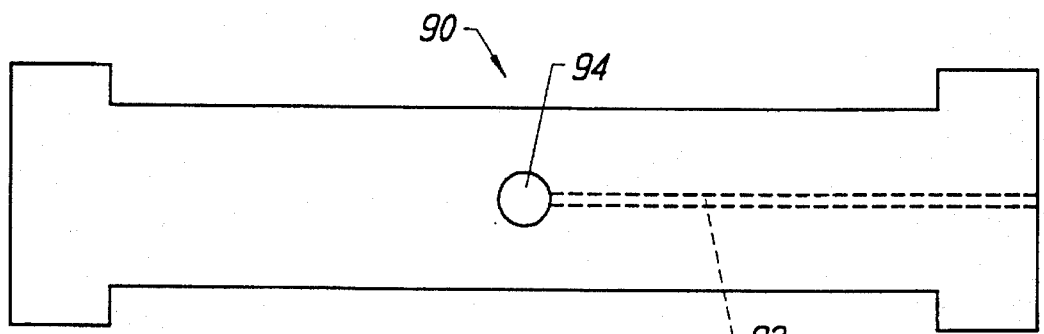
FIG. 5a is a top plan view of a gas feed tube housing of a gas manifold in accordance with a further aspect of the invention.
Figure 5B:
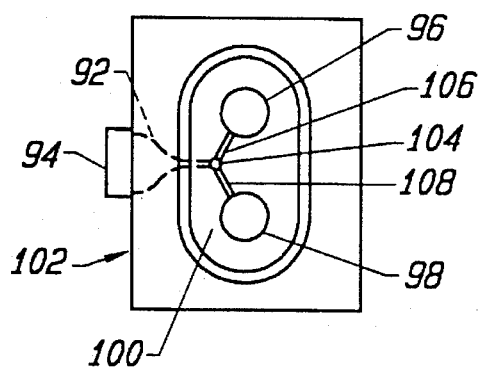

A gas leak checkhole may also be provided on housing 12, in replacement of or in addition to gas leak checkholes 52 and 72, so as to communicate with any combination of groove portions as previously discussed for forming removably sealable test gas channels. FIGS. 5a and 5b illustrate a gas feed tube housing 90 in accordance with this aspect of the invention. Gas feed tube housing 90, includes, similarly to housing 12, a pair of gas flow ports 96 and 98 through which respective gas flow paths extend, and a peripheral surface 100 extending around and surrounding gas flow ports 96 and 98.

Housing 90 also includes a gas leakcheck hole 92 which is sealable by a seal plug 94, both of which may be configured similarly to the previously described gas leakcheck holes and seal plugs. Gas leakcheck hole 92 extends from a top surface 102 of housing 90 to peripheral surface 100, where it has a hole or port 104 arranged between gas flow ports 106 and 108. A first groove portion 106 and a second groove portion 108 are provided, for example by cutting or milling, into peripheral surface 100. First groove portion 106 connects gas flow port 96 to port 104 of gas leakcheck hole 92, while second groove portion 108 connects gas flow port 98 to port 104 of gas leakcheck hole 92.

When connected in the gas manifold of the invention, gas flow ports 96 and 98 are substantially aligned with respective gas flow ports of gas feed endblock 14 or 50 or with respective gas flow ports of gas inject endblock 16 or 70, and respective peripheral surfaces substantially engage for providing sealing in a manner as described previously. While FIGS. 5a and 5b illustrate a single gas leak checkhole, more than one gas leak checkhole may be provided in housing 90, for example to communicate with opposite peripheral surfaces of housing 90. Alternatively, gas leak checkhole 92 may be symmetrically provided with another branch extending to the peripheral surface at the end of housing 90 opposite peripheral surface 100. It is also contemplated that only one of groove portions 106 and 108 is provided for communicating gas leak checkhole 92 with a selected one of gas flow ports 96 and 98, while the other gas flow port may communicate with a gas leak checkhole provided an appropriately connected endblock. Many various arrangements of gas leak checkholes and groove portions are possible, as will be appreciated by those skilled in the art, in order to obtain various substantially unobstructed channels for precise and reliable leak checking of selected seals of the gas manifold.

Although only some preferred embodiments of the present invention have been described herein, it should be understood that the present invention may be embodied in many other specific forms without departing from the spirit or scope of the invention. For example, it is possible to provide a groove portion in a selected peripheral surface, which extends in the peripheral surface from a selected gas flow port all the way directly to the outer surface of a selected element, i.e. gas feed endblock, gas inject endblock, or housing of the gas manifold assembly. In addition, gas test channels may be provided to check seals at points where the manifold is connected to the chamber lid of the CVD reactor. Such channels would include groove portions provided at selected peripheral surfaces at the bottoms of endblocks 50 and 70, and/or in selected peripheral surfaces of the chamber lid where the endblocks of the manifold assembly are connected. Therefore, the present examples are to be considered as illustrative and not restrictive, and the invention is not to be limited to the details given herein, but may be modified within the scope of the appended claims.

What is claimed is:

1. A chemical vapor deposition apparatus comprising:

a gas manifold;

at least one gas flow path extending in the chemical vapor deposition apparatus at least through said gas manifold;

a first peripheral surface of said gas manifold extending about a first gas flow port of said gas manifold, said gas flow path extending through said first gas flow port;

a second peripheral surface extending about a second gas flow port, said gas flow path extending through said second gas flow port;

a connection of said gas manifold such that said first and second peripheral surfaces substantially mutually engage intended for providing a substantial seal of said gas flow path;

a groove provided along at least one of said first and second peripheral surfaces and extending so as to communicate with at least one of said first and second gas flow ports for facilitating flow of a test gas in said groove from outside the chemical vapor deposition apparatus towards said respective gas flow port.

2. The chemical vapor deposition apparatus of claim 1 wherein said connection of said gas manifold comprises at least one gasket arranged about said gas flow path.

3. The chemical vapor deposition apparatus of claim 1 wherein said gas manifold comprises a gas feed tube housing and an endblock, said endblock comprising said first peripheral surface and said first gas flow port, said gas feed tube housing comprising said second peripheral surface and said second gas flow port, said groove being provided along said first peripheral surface and communicating with said first gas flow port.

4. The chemical vapor deposition apparatus of claim 3 comprising a gas leak check port extending through said endblock from an outer surface thereof to said first peripheral surface, said groove extending along said first peripheral surface from said gas leak check port to said first gas flow port.

5. The chemical vapor deposition apparatus of claim 4 wherein said endblock is a gas feed endblock.

6. The chemical vapor deposition apparatus of claim 4 wherein said endblock is a gas inject endblock.

7. The chemical vapor deposition apparatus of claim 1 wherein said gas manifold comprises a gas feed tube housing and an endblock, said endblock comprising said first peripheral surface and said first gas flow port, said gas feed tube housing comprising said second peripheral surface and said second gas flow port, said groove being provided along said second peripheral surface and communicating with said second gas flow port.

8. The chemical vapor deposition apparatus of claim 7 comprising a gas leak check port extending through said gas feed tube housing from an upper surface thereof to said second peripheral surface, said groove extending along said first peripheral surface from said gas leak cheek port to said first gas flow port.

9. The chemical vapor deposition apparatus of claim 1 wherein said groove extends along said at least one of said first and second peripheral surfaces from said at least one of said first and second gas flow ports to an outer surface of the apparatus.

10. The chemical vapor deposition apparatus of claim 1 further comprising a gas chamber lid and wherein said gas manifold comprises an endblock, said endblock comprising said first peripheral surface and said first gas flow port, said gas chamber lid comprising said second peripheral surface and said second gas flow port, said groove being provided along said first peripheral surface and communicating with said first gas flow port.

11. A method for testing a seal of a chemical vapor deposition apparatus gas manifold for leaks, said seal comprising a pair of mutually engaging peripheral surfaces which surround a gas flow port through which a gas flow path extends, the method comprising the steps of:

providing a groove along at least one of said mutually engaging peripheral surfaces such that said groove extends so as to communicate with said gas flow port for facilitating flow of a test gas in said groove;

drawing a vacuum in said gas manifold;

providing a test gas in an area proximate said seal of the gas manifold; and detecting the entrance of said test gas inside the gas flow path through said seal in order to determine the reliability of said seal.

12. The method according to claim 11 wherein said test gas is helium.

13. The method according to claim 11 wherein said gas manifold is connected with a sealable chamber of the chemical vapor deposition apparatus, and wherein said step of drawing a vacuum in said gas manifold comprises drawing a vacuum in said chamber, and wherein said step of detecting the entrance of said test gas inside the gas flow path through said seal comprises detecting the presence of said test gas inside said chamber.

14. A chemical vapor deposition apparatus for use in fabricating integrated circuit chips, said chemical vapor deposition apparatus comprising a sealable chamber with a chamber lid and a gas mixing manifold adapted for receiving at least one gas and for delivering said gas into said chamber, said gas mixing manifold comprising:

a gas feed tube housing having a first end and a second end;

a gas feed endblock connected to said first end of said gas feed tube housing;

a gas inject endblock connected to said second end of said gas feed tube housing;

at least one gas flow path extending in the chemical vapor deposition apparatus at least inside said housing and said endblocks of the gas mixing manifold;

at least one gas flow port of said gas feed endblock, said gas flow path extending through said gas flow port of said gas feed endblock;

a peripheral surface of said gas feed endblock extending about said gas flow port of said gas feed endblock;

at least one gas flow inlet port of said housing, said gas flow path extending through said gas flow inlet port;

an inlet peripheral surface of said housing extending about said gas flow inlet port of said housing;

at least one gas flow outlet port of said housing, said gas flow path extending through said gas flow outlet port;

an outlet peripheral surface of said housing extending about said gas flow outlet port of said housing;

at least one gas flow port of said gas inject endblock, said gas flow path extending through said gas flow port of said gas inject endblock;

a peripheral surface of said gas inject endblock extending about said gas flow port of said gas inject endblock;

a first seal connection of said gas mixing manifold such that said peripheral surface of said gas feed endblock and said inlet peripheral surface of said housing substantially mutually engage and mange a first gasket about said gas flow path intended for providing substantial sealing of said gas flow path;

a second seal connection of said gas mixing manifold such that said peripheral surface of said gas inject endblock and said outlet peripheral surface of said housing substantially mutually engage and mange a second gasket about said gas flow path intended for providing substantial sealing of said gas flow path; and at least one channel having at least one groove portion which is provided along a first selected peripheral surface chosen from said peripheral surfaces of said gas mixing manifold, said groove portion of said channel being arranged in contact with a selected gas flow port chosen from said gas flow ports of said gas mixing manifold, and said channel extending from said groove portion to outside the gas mixing manifold.

15. A chemical vapor deposition apparatus according to claim 14 wherein said channel has a groove portion arranged in contact with said gas flow port of said gas feed endblock and wherein said channel extends through said gas feed endblock.

16. A chemical vapor deposition apparatus according to claim 14 comprising a first said channel having a groove portion arranged in contact with said gas flow port of said gas feed endblock, and a second said channel having a groove portion arranged in contact with said gas flow port of said gas inject endblock.

17. A chemical vapor deposition apparatus according to claim 16 wherein said first said channel extends through said gas feed endblock, and wherein said second said channel extends in said gas inject endblock.

18. A chemical vapor deposition apparatus according to claim 14 wherein said channel extends through said gas feed tube housing.

19. A chemical vapor deposition apparatus according to claim 14 adapted for receiving at least two gases and for delivering said two gases in a mixed state into said chamber, comprising: a pair of said gas flow paths; a pair of said gas flow ports of said gas feed endblock; a pair of gas flow inlet ports of said housing; a pair of gas flow outlet ports of said housing; and a pair of said gas flow ports of said gas inject endblock.

* * * * *